United States Patent
Takahashi et al.

(10) Patent No.: US 8,455,059 B2
(45) Date of Patent: Jun. 4, 2013

(54) METHOD OF PRODUCING GAS BARRIER LAYER, GAS BARRIER FILM FOR SOLAR BATTERIES AND GAS BARRIER FILM FOR DISPLAYS

(75) Inventors: Toshiya Takahashi, Shizuoka (JP); Kouji Tonohara, Kanagawa (JP); Shinsuke Takahashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 470 days.

(21) Appl. No.: 12/725,577

(22) Filed: Mar. 17, 2010

(65) Prior Publication Data

US 2010/0239482 A1 Sep. 23, 2010

(30) Foreign Application Priority Data

Mar. 17, 2009 (JP) ................................. 2009-064446

(51) Int. Cl.
*H05H 1/24* (2006.01)
(52) U.S. Cl.
USPC ............................ 427/577; 427/578; 427/579
(58) Field of Classification Search
USPC .......................................... 427/577, 578, 579
See application file for complete search history.

(56) References Cited

U.S. PATENT DOCUMENTS

| | | | |
|---|---|---|---|
| 6,743,524 B2 | 6/2004 | Schaepkens | |
| 7,815,981 B2 | 10/2010 | Iwanaga et al. | |
| 7,815,982 B2 | 10/2010 | Iwanaga | |
| 2003/0219632 A1* | 11/2003 | Schaepkens | 428/698 |
| 2004/0175512 A1 | 9/2004 | Schaepkens | |
| 2004/0175580 A1 | 9/2004 | Schaepkens | |
| 2004/0209126 A1* | 10/2004 | Ziegler et al. | 428/702 |
| 2005/0153072 A1* | 7/2005 | Otani et al. | 427/248.1 |
| 2006/0226517 A1* | 10/2006 | Iwanaga et al. | 257/639 |
| 2007/0082487 A1* | 4/2007 | Chiang et al. | 438/687 |
| 2007/0281391 A1* | 12/2007 | Ito et al. | 438/109 |
| 2008/0211066 A1 | 9/2008 | Akedo et al. | |
| 2009/0291233 A1* | 11/2009 | Takahashi et al. | 427/569 |
| 2010/0092781 A1* | 4/2010 | Zambov et al. | 428/412 |
| 2010/0178490 A1* | 7/2010 | Cerny et al. | 428/315.5 |
| 2012/0003500 A1* | 1/2012 | Yoshida et al. | 428/688 |

FOREIGN PATENT DOCUMENTS

| | | |
|---|---|---|
| JP | 07-307276 | 11/1995 |
| JP | 2004-160977 | 6/2004 |
| JP | 2006-263989 | 10/2006 |
| JP | 2006-289821 | 10/2006 |
| JP | 2008-214677 | 9/2008 |

OTHER PUBLICATIONS

Brassard, D., et al., "Dielectric properties of amorphous hydrogenated silicon carbide thin films grown by plasma-enhanced chemical vapor deposition". Journal of Applied Physics, vol. 93, No. 7, Apr. 1, 2003, pp. 4066-4071.*
Tu, Hung-En, et al., "Low-k SiCxNy Films Prepared by Plasma-Enhanced Chemical Vapor Deposition Using 1,3,5-trimethyl-1,3,5-trivinylcyclotrisilazane Precursor." Journal of the Electrochemical Society, 159 (5) G56-G61 (2012).*
Zambov, Ludmil, et al., "Advanced chemical vapor deposition silicon carbide barrier technology for ultralow permeability applications". J. Vac. Sci. Technol. A 24(5), Sep./Oct. 2006, pp. 1706-1713.*
Schaepkens, Marc, et al., "Ultrahigh barrier coating deposition on polycarbonate substrates". J. Vac. Sci. Technol. A 22(4), Jul./Aug. 2004, pp. 1716-1722.*
JP Office Action dated Dec. 25, 2012, with English translation; Application No. 2009-064446.

* cited by examiner

*Primary Examiner* — Bret Chen
(74) *Attorney, Agent, or Firm* — Young & Thompson (57) ABSTRACT

A method according to the invention comprises: starting plasma discharge for forming the gas barrier layer in a film deposition chamber; and producing the gas barrier layer by using a plasma after a first predetermined period of time has elapsed from a start of the plasma discharge.

16 Claims, 2 Drawing Sheets

METHOD OF PRODUCING GAS BARRIER LAYER, GAS BARRIER FILM FOR SOLAR BATTERIES AND GAS BARRIER FILM FOR DISPLAYS

BACKGROUND OF THE INVENTION

The present invention relates to a method of producing a gas barrier layer using plasma-enhanced CVD, and more specifically to a gas barrier layer production method capable of forming a gas barrier layer having excellent gas barrier properties and oxidation resistance, as well as a gas barrier film for solar batteries and a gas barrier film for displays which use the gas barrier layer production method.

A gas barrier layer (a water-vapor barrier layer) is formed not only on sites or parts requiring moisture resistance in various devices including optical devices, display devices (e.g. liquid-crystal displays and organic EL displays), semiconductor devices and thin-film solar batteries, but also in packaging materials used to package food, clothing, electronic components, etc. A gas barrier film having a gas barrier layer formed on a plastic film substrate made of, for example, PET is used in various applications including the foregoing applications.

Layers made of various substances such as silicon oxide, silicon oxynitride and aluminum oxide are known gas barrier layers. A gas barrier layer made of silicon nitride is known as one of those layers. Plasma-enhanced CVD is a known method of producing a gas barrier layer made of silicon nitride.

For example, JP 2008-214677 A describes a gas barrier layer production method in which a gas barrier layer made of silicon nitride is formed on a substrate surface by plasma-enhanced CVD using silane gas, ammonia gas and a carrier gas, wherein two or more silicon nitride sublayers having different Si/N composition ratios are deposited by maintaining the substrate temperature at 200° C. or less and adjusting the flow rate ratio of the ammonia gas to the silane gas.

This production method is capable of obtaining a gas barrier layer which exhibits high oxidation resistance in a high temperature and high humidity environment, has few pinholes and exhibits high transparency (optical transmittance).

SUMMARY OF THE INVENTION

An oxidized gas barrier layer reduces the gas barrier properties, whereby desired gas barrier properties cannot be exhibited. Therefore, as also described in JP 2008-214677 A, the gas barrier layer is required to have not only gas barrier properties but also excellent oxidation resistance depending on the application. For example, a gas barrier film for use in solar batteries is required to have high enough oxidation resistance even in a high temperature and high humidity environment (e.g., 85° C., 85% RH), and a gas barrier film for use in displays is required to have high enough oxidation resistance even in a high temperature and high humidity environment (e.g., 60° C., 90% RH).

In order to meet such requirements, a variety of gas barrier layers and gas barrier layer production methods have been proposed. However, increasingly strict requirements are recently imposed on those properties of the gas barrier layer. Under the circumstances, there are many cases in which sufficient gas barrier properties and oxidation resistance cannot be obtained by merely controlling the composition ratio of the gas barrier film and the substrate temperature during film deposition as described in JP 2008-214677 A.

Accordingly, a production method has been desired with which a gas barrier layer having improved gas barrier properties and more excellent oxidation resistance in a high temperature and high humidity environment can be consistently produced.

In order to solve the aforementioned prior art problems, an object of the present invention is to provide a gas barrier layer production method capable of consistently forming a gas barrier layer which is excellent in gas barrier properties and in oxidation resistance in a high temperature and high humidity environment. Another object of the present invention is to provide a gas barrier film produced by this production method.

A method according to the invention comprises:
starting plasma discharge for forming the gas barrier layer in a film deposition chamber; and
producing the gas barrier layer by using a plasma after a first predetermined period of time has elapsed from a start of the plasma discharge.

DETAILED DESCRIPTION OF THE INVENTION

On the following pages, the gas barrier layer production method as well as the gas barrier film for solar batteries and the gas barrier film for displays according to the present invention are described in detail with reference to the preferred embodiments shown in the accompanying drawings.

Figure 1:
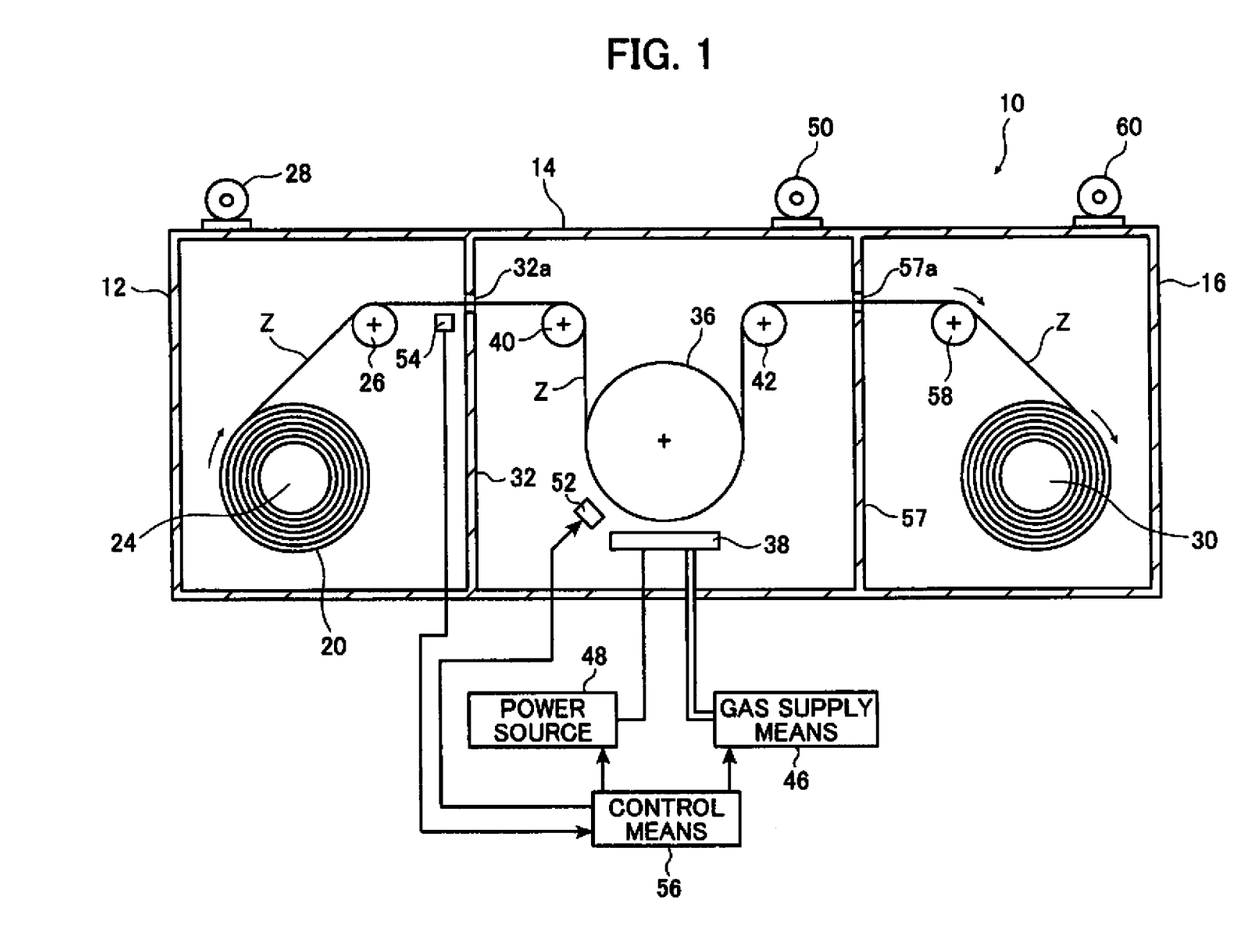
FIG. 1 is a view schematically showing a production device used to implement the gas barrier layer production method in an embodiment of the present invention.

FIG. 1 schematically shows a production device used to implement the gas barrier layer production method in an embodiment of the present invention.

The illustrated gas barrier layer production device 10 produces a gas barrier film by depositing or forming a gas barrier layer by plasma-enhanced CVD on a surface of an elongated flexible film (substrate film) Z, that is, a film material as it travels in a longitudinal direction.

This production device 10 is a film deposition device by a so-called roll-to-roll system with which the flexible film Z is fed from a substrate roll 20 having the elongated flexible film Z wound into a roll, a gas barrier layer is formed on the flexible film Z traveling in the longitudinal direction and the flexible film Z having the gas barrier layer formed thereon, that is, the gas barrier film is wound into a roll.

In the production method of the present invention, an example of the flexible film that may be preferably used includes an elongated sheet as in the illustrated case, but various articles including a film cut into a sheet with a predetermined length (cut sheet), optical devices such as lenses and optical filters, photoelectric transducers such as organic EL devices and solar batteries, and display panels such as liquid-crystal displays and electronic paper may also be advantageously used for the flexible film.

The material of the flexible film is also not particularly limited and various materials may be used as long as a gas barrier layer can be formed by plasma-enhanced CVD. The flexible film may be made of organic materials as in plastic films (resin films) or of inorganic materials such as metals and ceramics.

The present invention is advantageously used to produce a gas barrier film as in the illustrated case, and sheet-like flexible films made of organic materials such as polyethylene terephthalate (PET), polyethylene naphthalate, polyethylene, polypropylene, polystyrene, polyamide, polyvinyl chloride, polycarbonate, polyacrylonitrile, polyimide, polyacrylate, and polymethacrylate are used with advantage.

In the present invention, base materials such as plastic films and lenses having layers formed thereon to impart various functions may be used for the flexible film. Exemplary layers include a protective layer, an adhesive layer, a light-reflecting layer, a light-shielding layer, a planarizing layer, a buffer layer, and a stress-relief layer.

Figure 2:
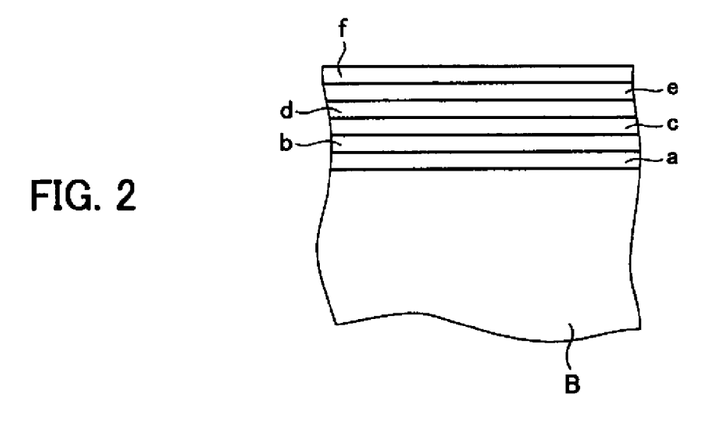
FIG. 2 is a partial cross-sectional view showing a flexible film used in this embodiment.

The flexible film used may be one having one layer formed on a base material or one having a plurality of layers such as layers a to f formed on a base material B as conceptually shown in FIG. 2. In a flexible film having one or more than one layer formed on the base material B, at least one of the layers (at least one of the layers a to f in FIG. 2) may be a gas barrier layer formed by the production method of the present invention. A flexible film having the gas barrier layers of the present invention and other layers formed alternately may also be advantageously used, and in this case, the layers other than the gas barrier layers may be made of a single material or different materials. In a flexible film having one or more than one layer on the base material B, at least one of the layers (at least one of the layers a to f in FIG. 2) may also be patterned.

In the present invention, in the case of using such flexible film having one or more than one layer formed on a base material, the uppermost layer, that is, at least a part of the layer on which a film is to be deposited is preferably made of an organic material.

In other words, in the production method of the present invention, at least a part of the surface on which the gas barrier layer is to be formed is preferably made of an organic material. This point will be described later in further detail.

In cases where irregularities or foreign substances having considerably larger sizes than the thickness of the gas barrier layer are formed at the surface of the flexible film, the gas barrier properties deteriorate, making it impossible to obtain desired gas barrier properties even if high oxidation resistance is achieved.

Therefore, the flexible film used is preferably one which has a sufficiently smooth surface and to which few foreign substances adhere.

As described above, the production device 10 shown in FIG. 1 is a film deposition device by a so-called roll-to-roll system in which the flexible film Z is fed from the substrate roll 20 having the elongated flexible film Z wound into a roll, a gas barrier layer is formed on the flexible film Z traveling in the longitudinal direction and the flexible film Z having the gas barrier layer formed thereon is rewound into a roll. The production device 10 includes a feed chamber 12, a film deposition chamber 14 and a take-up chamber 16.

In addition to the illustrated members, the production device 10 may also have various members of a film deposition device by means of plasma-enhanced CVD including various sensors, and various members (transport means) for transporting the flexible film Z along a predetermined path, as exemplified by a transport roller pair and a guide member for regulating the position in the width direction of the flexible film Z.

In addition, the production device 10 may include a plurality of plasma CVD film deposition chambers or at least one film deposition chamber for depositing a film by other vapor deposition techniques than plasma-enhanced CVD, flash evaporation or sputtering and/or at least one surface treatment chamber for plasma treatment may be connected to the production device.

The feed chamber 12 includes a rotary shaft 24, a guide roller 26 and a vacuum evacuation means 28. A detection means 54 is provided furthest downstream in the feed chamber 12.

The substrate roll 20 into which the elongated flexible film Z is wound is mounted on the rotary shaft 24 of the feed chamber 12.

Upon mounting of the substrate roll 20 on the rotary shaft 24, the flexible film Z travels along a predetermined travel path starting from the feed chamber 12 and passing through the film deposition chamber 14 to reach a take-up shaft 30 of the take-up chamber 16.

Feeding of the flexible film Z from the substrate roll 20 and winding of the flexible film Z on the take-up shaft 30 of the take-up chamber 16 are carried out in synchronism in the production device 10 to continuously form the gas barrier layer on the elongated flexible film Z in the film deposition chamber 14 by plasma-enhanced CVD as the flexible film Z travels in its longitudinal direction along the predetermined travel path.

Figure 3:
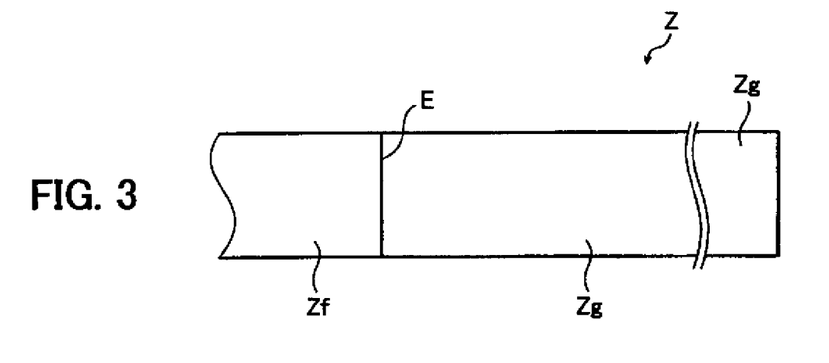
FIG. 3 is a partial plan view showing the flexible film used in this embodiment from the film deposition surface side.

In the illustrated embodiment, the whole area of the flexible film Z is not used for the product (gas barrier film) but as shown in FIG. 3, the flexible film Z in a preferred embodiment has on its advancing end side a guide base portion Zg, which is followed by a film base portion Zf corresponding to the product.

As described above, the flexible film Z is required to pass through the production device 10 from the feed chamber 12 to the take-up shaft 30 of the take-up chamber 16 in order to form the gas barrier layer on the flexible film Z. Therefore, part of the flexible film Z that has reached downstream (take-up chamber 16 side or advancing end side) from the film deposition region in the film deposition chamber (for example from the position facing a shower head electrode 38) before supply of the gas material and start of plasma excitation power (plasma discharge) becomes useless because no gas barrier film can be formed.

It is necessary to use the flexible film Z of high quality whose surface has been subjected to various treatments including cleaning and smoothing in order to obtain a high-quality gas barrier film having high gas barrier properties, transparency and oxidation resistance. In other words, the flexible film Z is also expensive in order to produce a high-quality gas barrier film.

Therefore, making such an expensive flexible film useless is a cause of an increase in the gas barrier film production cost.

To prevent such a situation, the illustrated flexible film Z is provided with the inexpensive guide base portion Zg downstream from the film base portion Zf which serves as a product such that the illustrated flexible film Z extending from the feed chamber 12 to the take-up shaft 30 has the guide base portion Zg at least on the downstream side of the film deposition position.

Use of such flexible film Z enables the wasteful use of the expensive film base portion Zf to be considerably reduced, leading to a decrease in the gas barrier film production cost.

The guide base portion Zg is not particularly limited and various types of sheets (bands and cords are also possible) which can consistently travel from the feed chamber 12 to the take-up shaft 30 and be consistently transported by transport means (guide rollers and a drum 36 to be described later) located between the feed chamber 12 and the take-up shaft 30 can be all used.

The guide base portion Zg is preferably a sheet made of the same material as the film base portion Zf. The flexible film Z having such a structure enables the reduction of fluctuations in the plasma discharge state, that is, plasma fluctuations during the passage of the boundary E between the guide base portion Zg and the film base portion Zf through the film deposition space, whereby plasma, that is, gas barrier film formation can be stabilized more quickly.

The length of the guide base portion Zg is also not particularly limited and may be appropriately set so as to avoid wasteful use of the film base portion Zf in accordance with the device configuration of the production device 10, the length of the path along which the flexible film Z travels from the feed chamber 12 to the take-up shaft 30, the travel path of the flexible film Z, and the timing between the start of plasma discharge and the start of flexible film traveling.

Although described later in detail, the detection means 54 located furthest downstream of the feed chamber 12 in the production device 10 detects the boundary E between the guide base portion Zg and the film base portion Zf to confirm that the boundary E has reached the film deposition chamber 14.

Therefore, the flexible film Z may optionally be provided with a mark for detecting the boundary E between the guide base portion Zg and the film base portion Zf. Examples of the mark include a mark which can be detected with visible light (can be visually checked), a mark which can be detected with infrared light or ultraviolet light, and a mark which can be mechanically detected as exemplified by a bump or a projection having such a size that traveling of the flexible film Z and formation of the gas barrier film are not impeded. Such marks may be provided on the front surface of the flexible film Z on which the gas barrier film is to be formed or on the back surface thereof. A through-hole may be provided in the flexible film Z as the mark for detecting the boundary E.

These marks may not be necessarily provided at the boundary E between the guide base portion Zg and the film base portion Zf but be provided at the guide base portion Zg. In other words, the speed at which the flexible film Z travels in the production device 10 is obviously known and therefore as a result of detection of the mark, the boundary E can be confirmed to have reached the film deposition chamber 14 based on the distance between the boundary E and the mark.

Instead of providing a mark, the guide base portion Zg and the film base portion Zf having different color tones, different light transmittances, or different surface roughnesses may be used in order to facilitate the detection of the boundary E. The flexible film Z may have such differences on its back surface side or front surface side.

The production method of the present invention can be more correctly implemented by providing in the flexible film Z an auxiliary means for detecting the boundary E. A plurality of auxiliary detection means may be used in combination.

In the feed chamber 12, the rotary shaft 24 is rotated by a drive source (not shown) in a clockwise direction in FIG. 1 so that the flexible film Z is fed from the substrate roll 20, is guided by the guide roller 26 along the predetermined path and passes through a slit 32a provided in a partition wall 32 to reach the film deposition chamber 14. The detection means 54 will be described later in detail.

In the preferred embodiment of the illustrated production device 10, the feed chamber 12 and the take-up chamber 16 are provided with vacuum evacuation means 28 and 60, respectively. The pressures in the neighboring chambers are prevented from affecting the degree of vacuum in the film deposition chamber 14 (formation of the gas barrier layer) by providing the vacuum evacuation means in these chambers so that the chambers may have during film deposition the same degree of vacuum (pressure) as the film deposition chamber 14 to be described later.

The vacuum evacuation means 28 is not particularly limited, and exemplary means that may be used include vacuum pumps such as a turbo pump, a mechanical booster pump, a rotary pump and a dry pump, an assist means such as a cryogenic coil, and various other known (vacuum) evacuation means which use a means for adjusting the ultimate degree of vacuum or the amount of air discharged and are employed in vacuum deposition devices. The same holds true for other vacuum evacuation means 50 and 60.

The present invention is not limited to the embodiment in which all the chambers are provided with vacuum evacuation means, and the feed chamber 12 and the take-up chamber 16 which require no vacuum evacuation treatment may not be provided with vacuum evacuation means. However, in order to minimize the adverse effect of the pressures in these chambers on the degree of vacuum in the film deposition chamber 14, the size of the portion such as the slit 32a through which the flexible film Z passes may be made as small as possible, or a subchamber may be provided between the adjacent chambers so that the internal pressure of the subchamber is reduced.

Even in the illustrated production device 10 in which all the chambers have the vacuum evacuation means, it is preferred to minimize the size of the portion such as the slit 32a through which the flexible film Z passes.

As described above, the flexible film Z is guided by the guide roller 26 to reach the film deposition chamber 14.

The film deposition chamber 14 is used to form a gas barrier layer made of silicon nitride, silicon carbide or silicon carbonitride on a surface of the flexible film Z by capacitively coupled plasma-enhanced CVD (hereinafter abbreviated as CCP-CVD).

The plasma-enhanced CVD used in the present invention is not limited to the illustrated CCP-CVD, and various types of plasma-enhanced CVD including inductively coupled plasma-enhanced CVD (ICP-CVD), microwave plasma CVD, electron cyclotron resonance CVD (ECR-CVD) and atmospheric pressure barrier discharge CVD are all available. The same principle can be applied to obtain the same effect even in catalytic CVD (Cat-CVD).

In the illustrated embodiment, the film deposition chamber 14 includes the drum 36, the shower head electrode 38, guide rollers 40 and 42, and a marking means 52. A gas supply means 46 and an RF power source 48 are connected to the shower head electrode 38 and a control means 56 is connected to the gas supply means 46, the RF power source 48 and the marking means 52. The vacuum evacuation means 50 is connected to the film deposition chamber 14. The detection means 54 is provided furthest downstream of the feed chamber 12, that is, just before the film deposition chamber 14.

The drum 36 in the film deposition chamber 14 is a cylindrical member rotating about the central axis in the counterclockwise direction in FIG. 1, and the flexible film Z guided by the guide roller 40 along the predetermined path is wrapped over a predetermined region of the peripheral surface to travel in the longitudinal direction as the flexible film Z is held at a predetermined position facing the shower head electrode 38 to be described later.

The drum 36 also serves as a counter electrode in CCP-CVD and forms an electrode pair with the shower head electrode 38.

To this end, the drum 36 is connected to a bias power source or grounded (connection is not shown in both the cases). Alternatively, the drum 36 may be capable of switching between connection to the bias power source and grounding.

In the production method of the present invention, the gas barrier layer is preferably formed by adjusting the temperature of the flexible film to 120° C. or less. It is particularly preferred to form the gas barrier layer by adjusting the temperature of the flexible film to 80° C. or less.

By adjusting the temperature of the flexible film to 120° C. or less, preferred results are obtained in that a gas barrier layer having advantageously high barrier properties and oxidation resistance and a low-stress gas barrier layer can be formed on a less heat-resistant plastic film substrate such as a PEN substrate or on a substrate using a less heat-resistant organic material as the base material. In addition, by adjusting the temperature of the flexible film to 80° C. or less, preferred results are obtained in that a gas barrier layer having advantageously high barrier properties and oxidation resistance and a low-stress gas barrier layer can be formed on a less heat-resistant plastic film substrate such as a PET substrate.

In order to form the gas barrier layer at 120° C. or less in the illustrated production device 10, the drum 36 preferably serves as the temperature adjusting means for keeping the flexible film Z at a temperature of 120° C. or less, in other words, the temperature adjusting means is preferably built into the drum 36.

The temperature adjusting means of the drum 36 is not particularly limited and various types of temperature adjusting means including one in which a refrigerant is circulated and a cooling means using a piezoelectric element are all available.

The shower head electrode 38 is of a known type used in film deposition by means of CCP-CVD.

In the illustrated embodiment, the shower head electrode 38 is, for example, in the form of a hollow rectangular solid and is disposed so that its largest surface faces the peripheral surface of the drum 36 and the perpendicular from the center of the largest surface coincides with the normal of the drum 36 with respect to its peripheral surface. A large number of through holes are formed at the whole surface of the shower head electrode 38 facing the drum 36.

In the illustrated production device 10, one shower head electrode (film deposition means by CCP-CVD) 38 is provided in the film deposition chamber 14. However, this is not the sole case of the present invention and a plurality of shower head electrodes may be disposed in the direction of travel of the flexible film Z. In this regard, the same holds true when using plasma-enhanced CVD of other type than CCP-CVD. For example, when a gas barrier layer is formed (produced) by ICP-CVD, a plurality of (induction) coils for forming an induced electric field (induced magnetic field) may be provided along the direction of travel of the flexible film Z.

The present invention is not limited to the case in which the gas barrier layer is formed by using the shower head electrode, and the gas barrier layer may be formed by using a common electrode in plate form and a gas supply nozzle.

The gas supply means 46 is of a known type used in vacuum deposition devices such as plasma CVD devices, and supplies a gas material into the shower head electrode 38.

As described above, a large number of through holes are formed at the surface of the shower head electrode 38 facing the drum 36. Therefore, the gas material supplied into the shower head electrode 38 passes through the through holes to be introduced into the space between the shower head electrode 38 and the drum 36.

In the gas barrier layer production method of the present invention, a film of silicon nitride, silicon carbide, or silicon carbonitride is deposited (formed) as the gas barrier layer.

Specific exemplary materials include silicon nitride, silicon carbide, silicon carbonitride, silicon oxynitride, silicon oxycarbide, silicon oxynitrocarbide, silicon nitride hydride, silicon carbide hydride, silicon nitrocarbide hydride, silicon oxynitride hydride, silicon oxycarbide hydride and silicon oxynitrocarbide hydride.

Any known gas may be used for the gas material depending on the gas barrier layer to be formed.

For example, in cases where the gas barrier layer to be formed is a silicon nitride film, the gas material that may be used include silane gas and/or disilane as well as ammonia gas and/or hydrazine and/or nitrogen gas.

Nitrogen gas, hydrogen gas and inert gases such as helium, neon, argon, krypton, xenon and radon may be used for the gas material in combination with the above gases.

The gas barrier layer formed by the production method of the present invention may of course include not only the gas barrier layer to be formed but also various substances inevitably incorporated therein. In cases where a gas barrier layer made of silicon nitride is to be formed by using silane gas, ammonia gas, nitrogen gas and hydrogen gas, the gas barrier layer may of course include, in addition to silicon nitride, various substances such as hydrogen inevitably incorporated therein.

The gas barrier layer produced by the production method of the present invention may be of a crystalline or amorphous structure, or of a combination of both the structures.

The production method of the present invention is not limited to the embodiment in which a gaseous material including gases is used for the material of the gas barrier layer and a liquid material may be used and vaporized to form the gas barrier layer. In cases where the gas barrier layer to be formed is, for example, a silicon carbonitride film, hexamethyldisilazane (HMDSN) and/or tetramethylsilane (TMS) may be used for the liquid material.

Alternatively, the gaseous material and the liquid material may be used in combination to form the gas barrier layer.

The RF power source 48 is one for supplying plasma excitation power to the shower head electrode 38. All known RF power sources used in various plasma CVD devices may be used for the RF power source 48.

In addition, the vacuum evacuation means 50 evacuates the film deposition chamber to keep it at a predetermined film deposition pressure in order to form the gas barrier layer by plasma-enhanced CVD, and is of a known type used in vacuum deposition devices as described above.

The control means 56 controls the operations of the gas supply means 46, the RF power source 48 and the vacuum evacuation means 50. The control means 56 will be described later in detail.

The marking means 52 marks the flexible film Z (film base portion Zf) in response to the command from the control means 56.

More specifically, the marking means 52 marks the flexible film Z, namely the film base portion Zf in response to the command from the control means 56. Marking will be described later in further detail.

The marking method using the marking means 52 is not particularly limited and marking methods capable of detection after the formation of the gas barrier layer are all available.

For example, in cases where the gas barrier film (product using the inventive production method) is transparent, it is preferred to put a visible mark as by laser marking with laser beams or by coloring using various recording heads.

The mark may be one capable of detection with infrared light or ultraviolet light. Alternatively, marking may be made by perforation with laser beams or mechanical means.

The marking position is also not particularly limited and the flexible film on which the gas barrier layer is to be formed thereon is preferably marked outside the region used for the product. For example, the illustrated long flexible film Z is preferably marked in the vicinity of the end in its width direction perpendicular to the longitudinal direction.

Marking may be made on the front surface of the flexible film Z on which the gas barrier layer is to be formed (deposited) or the back surface of the flexible film Z on which no gas barrier layer is to be deposited. The flexible film surface may be cracked due to the marking on the surface of the flexible film on which the gas barrier layer is to be deposited, depending on the strength of the flexible film surface on which the gas barrier layer is to be deposited and the magnitude of the impact due to marking. Therefore, in view of this point, it is more advantageous to mark the back surface of the flexible film.

As described above, the detection means 54 is disposed furthest downstream of the feed chamber 12.

The detection means 54 is the portion which detects the boundary E between the guide base portion Zg and the film base portion Zf (including the mark) in the flexible film Z traveling from the feed chamber 12 to the take-up chamber 16 and send information for the detection of the boundary E to the control means 56.

As will be described later in detail, in the production method of the present invention, the plasma before the elapse of a predetermined period of time (first predetermined period of time) from the start of the plasma discharge for forming the gas barrier layer is not used to produce the gas barrier layer. The flexible film used in the illustrated case is one having the guide base portion Zg. In a preferred embodiment using such a guide base portion Zg, a second predetermined period of time from the point in time when the boundary E between the guide base portion Zg and the film base portion Zf reached the film deposition chamber 14 (vacuum chamber) is regarded as the first predetermined period of time from the start of the plasma discharge, and the plasma during this period is not used to form the gas barrier layer.

The method of detecting the boundary E using the detection means 54 is not particularly limited and various detection methods suitable to the boundary E or the states of the guide base portion Zg and the film base portion Zf are available.

For example, in cases where the boundary E can be detected with visible light, the boundary E may be detected by various optical detection methods using visible light. In cases where the boundary E can be detected with infrared light or ultraviolet light, the boundary E may be detected by various detection methods using such light. In cases where the boundary E can be mechanically detected with a bump or a projection, methods may be used in which the bump or the projection is detected from the impact caused by contact with a detection member. Alternatively, the bump or the projection may be optically detected.

In cases where the color and the optical transparency are different between the guide base portion Zg and the film base portion Zf, the boundary E may be detected based on the detection of the color or optical transparency of the flexible film Z using an optical means. In cases where the surface properties such as the surface roughness are different between the guide base portion Zg and the film base portion Zf, the boundary E may be detected based on the detection of the surface roughness.

A plurality of detection methods may be used in combination.

The illustrated embodiment detects the boundary E between the guide base portion Zg and the film base portion Zf from the front surface side of the flexible film Z on which the gas barrier layer is to be formed. However, this is not the sole case of the present invention and the boundary E may be detected from the back surface side opposite to the film deposition surface.

The control means 56 controls the supply of various material gases from the gas supply means 46, supply of the plasma excitation power from the RF power source 48 to the shower head electrode 38, the pressure of the film deposition chamber 14, the temperature of the flexible film Z and the distance between the electrodes.

In the method of producing the gas barrier layer according to the present invention, the conditions of forming the gas barrier layer are not particularly limited except that the plasma before the elapse of the first predetermined period of time from the start of the plasma discharge for forming the gas barrier layer is not used to produce the gas barrier layer.

Therefore, as in formation of the gas barrier layer by a conventional plasma-enhanced CVD technique, the conditions of film deposition such as the flow rates of the material gases, the film deposition pressure, the plasma excitation power, the frequency of the plasma excitation power, the distance between the electrodes, the bias potential applied to the flexible film, and the temperature of the flexible film Z may be appropriately set in accordance with the type of the gas barrier layer to be formed, the film deposition rate to be applied, the thickness of the gas barrier layer to be obtained, the type of material gases used, the layout and size of the film deposition chamber, and the physical properties of the flexible film Z (base material of the flexible film Z).

The thickness of the gas barrier layer is also not particularly limited and may be appropriately set in accordance with the application and the required gas barrier properties so that sufficient gas barrier properties may be exhibited. However, the gas barrier layer preferably has a thickness of at least 5 nm because the gas barrier layer surface may be almost naturally oxidized at a gas barrier layer thickness of less than 5 nm.

In the present invention, the film deposition rate is preferably set to at least 300 nm/min with the flexible film Z being at rest (in terms of static film deposition rate).

As will be described layer in detail, the present invention produces the gas barrier layer without using the plasma before the elapse of the predetermined period of time from the start of the plasma discharge for forming the gas barrier layer. In this way, the present invention is capable of consistently producing the gas barrier layer which is excellent not only in the gas barrier properties but also in the oxidation resistance in a high temperature and high humidity environment while preventing the reduction of the oxidation resistance due to the formation of the gas barrier layer with plasma under unstable discharge.

The higher the film deposition rate is, the more the oxidation resistance is reduced due to the unstable plasma just after the start of the discharge. If the film deposition rate is higher, the amount of gas material supplied is to be increased, thus involving more time to stabilize the discharge, namely leading to considerably reduced oxidation resistance.

In other words, in the production method of the present invention, the effect of the present invention that the oxidation resistance of the gas barrier layer is prevented from being reduced due to plasma under unstable discharge can be advantageously exhibited by setting the static film deposition rate to at least 300 nm/min. The static film deposition rate is more preferably at least 500 nm/min because this effect can be more advantageously exhibited.

Upon receipt of information indicating that the detection means 54 detected the boundary E between the guide base portion Zg and the film base portion Zf in the flexible film Z, the control means 56 detects the timing at which the boundary E will reach the film deposition chamber 14 based on the distance between the detection means 54 and the film deposition chamber 14. The control means 56 issues a command to the marking means 52 so as to mark the flexible film at a point in time when the appropriately set second predetermined period of time has elapsed from the entry of the boundary E into the film deposition chamber 14.

In response to the command, the marking means 52 marks the surface of the flexible film Z. In the illustrated embodiment, since the marking means 52 is located on the upstream side from the film deposition region (shower head electrode 38), marking at this timing allows the marking position to reach the film deposition region after the elapse of the second predetermined period of time from the entry of the boundary E into the film deposition chamber 14 (after the elapse of the first predetermined period of time from the start of the plasma discharge).

An alternative process may be applied in which the marking means 52 is located downstream from the film deposition region and the control means 56 issues a command to the marking means 52 so that marking may be made based on the position of the marking means 52 and the travel speed of the flexible film Z at a point in time when the second predetermined period of time has elapsed from the entry of the boundary E into the film deposition chamber 14.

In the preferred embodiment, the illustrated production device 10 uses the flexible film Z having the guide base portion Zg. However, the production method of the present invention can also be advantageously used in the flexible film Z having no guide base portion Zg.

The flexible film Z having no guide base portion Zg may include not only one wholly composed of the film base portion Zf, but also one using a base material having the guide base portion Zg, and one in which films for exhibiting various functions are already formed in the region containing the boundary E. In other words, the latter flexible films Z may be treated as ones having the guide base portion Zg or ones having no guide base portion Zg.

In cases where the flexible film Z having no guide base portion Zg is used, the control means 56 also issues a command to the marking means 52 so that marking may be made after the elapse of the first predetermined period of time from the point in time when the RF power source 48 supplied plasma excitation power to the shower head electrode 38, that is, the plasma discharge for forming the gas barrier layer was started.

In cases where the boundary E of the flexible film Z having the guide base portion Zg has passed through the film deposition region or the film deposition chamber 14 at the start of the plasma discharge due to the length of the guide base portion Zg or the timing at which the plasma discharge is started, the control means 56 also issues a command to the marking means 52 so that marking may be made after the elapse of the first predetermined period of time from the start of the plasma discharge for forming the gas barrier layer.

In cases where supply of the plasma excitation power is stopped (or unnecessarily stopped), then restored during the formation of the gas barrier layer, the control means 56 also issues a command to the marking means 52 so that marking may be made after the elapse of the first predetermined period of time from the restart of plasma discharge.

Why the flexible film Z having the guide base portion Zg is marked after the elapse of the second predetermined period of time from the entry of the boundary E between the guide base portion Zg and the film base portion Zf in the flexible film Z into the film deposition chamber 14 will be described below in detail.

The advancing end region from the marking position in the gas barrier film produced by the production method of the present invention is not used as a gas barrier film or a product. In cases where the discharge is stopped, then restarted during film deposition, the region between the discharge stop position and the marking position is also not used for the gas barrier film but is removed. In other words, in the present invention, the plasma is not used for film production before the elapse of the first predetermined period of time from the start of the discharge for forming the gas barrier layer (before the elapse of the second predetermined period of time from the entry of the boundary E into the film deposition chamber 14 in the illustrated case).

Accordingly, the present invention is capable of consistently producing the gas barrier layer having not only high gas barrier properties but also high oxidation resistance even in a high temperature and high humidity environment.

Gas barrier layers deposited by plasma-enhanced CVD using silicon nitride, silicon carbide and silicon carbonitride may not have sufficient gas barrier properties and oxidation resistance.

The inventors of the present invention have made an intensive study on the cause and found that the plasma discharge does not stabilize before the elapse of a certain period of time from the start of the discharge, and the gas barrier layer plasma-deposited by plasma discharge in such an unstable state does not have sufficient gas barrier properties and oxidation resistance. It has also been found that the oxidation resistance is considerably reduced in cases where at least a part of the film deposition surface is made of an organic material.

Figure 4:
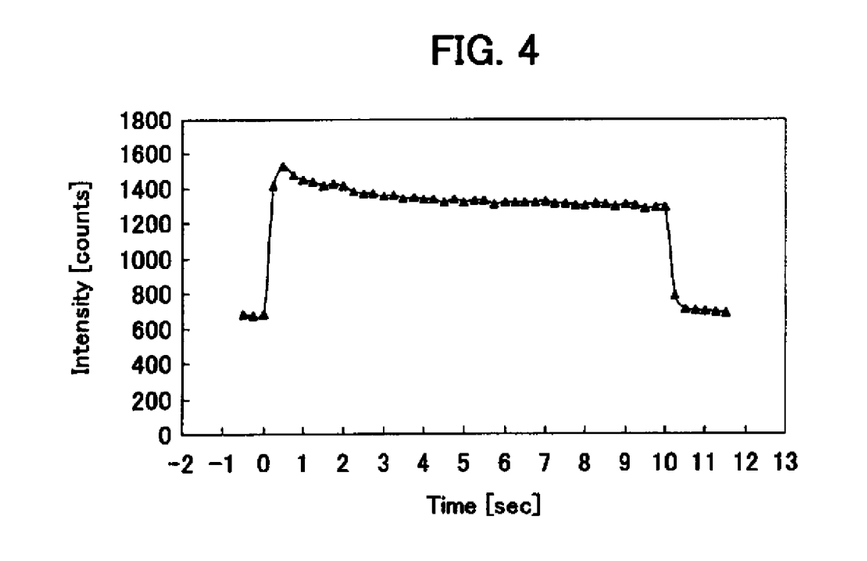
FIG. 4 is a graph showing the relation between the time course after the start of plasma discharge and the emission intensity derived from hydrogen radicals.

FIG. 4 shows a time variation of the emission intensity of light at 656 nm derived from hydrogen radicals, from the start of the plasma discharge for film deposition when the gas barrier layer of silicon nitride is formed using silane gas, ammonia gas, nitrogen gas and hydrogen gas. Many hydrogen radicals are produced from not only hydrogen gas but also silane gas and ammonia gas. Therefore, not only the amount of hydrogen radicals but also the behaviors of the silicon-containing radicals and the nitrogen-containing radicals can also be indirectly known.

As shown in FIG. 4, the emission intensity of the hydrogen radicals abruptly rises just after the start of the plasma discharge (at 0 second) and decreases with time to stabilize at around 3 seconds. Therefore, plasma discharge that has just been started is in an unstable state and the gas barrier layer deposited by plasma in such a state does not exhibit the desired gas barrier properties and oxidation resistance.

The present invention has been made based on the above finding and as described above, the plasma before the elapse of the first predetermined period of time from the start of the plasma discharge is not used to produce the gas barrier layer. According to the present invention as described above, the gas barrier layer is produced by only using the plasma in a stable plasma discharge state and therefore the gas barrier layer having not only excellent gas barrier properties but also excellent oxidation resistance in a high temperature and high humidity environment can be consistently produced. The present invention is particularly advantageous in the flexible film Z having at least a part of the film deposition surface made of an organic material in which the oxidation resistance is considerably reduced due to unstable plasma discharge.

The illustrated case in which the gas barrier layer is produced by a roll-to-roll system (gas barrier film production device by means of a roll-to-roll system) ensures that regions where the desired performance cannot be obtained are extracted and removed.

Even after the plasma discharge has stabilized, when the boundary E between the guide base portion Zg and the film base portion Zf passes through the plasma discharge region, that is, the film deposition region, the plasma state fluctuates at the boundary E in the flexible film Z having the guide base portion Zg due to differences in the surface properties between the guide base portion Zg and the film base portion Zf. In other words, the plasma discharge is rendered unstable as at the start of discharge.

Therefore, in cases where the flexible film Z having the guide base portion Zg is used, it is preferred not to use the plasma before the elapse of the first predetermined period of time from the passage of the boundary E through the film deposition region.

Therefore, in the present invention, in cases where the flexible film Z having the guide base portion Zg is used, it is preferred to use the second predetermined period of time appropriately set so as to reliably correspond to the first predetermined period of time from the passage of the boundary E having reached the film deposition chamber 14 through the film deposition region such that the plasma before the elapse of the second predetermined period of time from the entry of the boundary E into the film deposition chamber is not used to produce the gas barrier layer.

In other words, in cases where the flexible film Z having the guide base portion Zg is used, the elapse of the second predetermined period of time from the entry of the boundary E into the film deposition chamber 14 is preferably regarded as that of the first predetermined period of time from the start of the plasma discharge.

In the illustrated embodiment, as described above, the control means 56 issues a command to the marking means 52 so that marking may be made after the elapse of the second predetermined period of time from the entry of the boundary E into the film deposition chamber 14.

In cases where the flexible film Z having the guide base portion Zg is used, as described above, it is preferred to use the flexible film Z having the guide base portion Zg made of the same material as the film base portion Zf because fluctuations in the plasma discharge during the passage of the boundary E through the film deposition region can be reduced. In other words, use of the flexible film Z having the guide base portion Zg made of the same material as the film base portion Zf is preferred because the second predetermined period of time from the point in time when the boundary E reached the film deposition chamber 14 can be shortened.

In cases where the flexible film Z having the guide base portion Zg is used, the marking means 52 may be caused to mark the flexible film Z at the point in time when the first predetermined period of time has passed after the boundary E got out of the film deposition region. In other words, the point in time when the boundary E got out of the film deposition region may be regarded as the starting point of the plasma discharge.

In this case, the film deposition region may be appropriately set in accordance with, for example, the region of the flexible film Z facing the shower head electrode 38 (electrode to which the plasma excitation power is supplied; induction coil in CCP-CVD), the region where radical luminescence can be confirmed, the device configuration and the film deposition rate.

The gas barrier layer produced by the above-described production method of the present invention has not only excellent gas barrier properties but also excellent oxidation resistance.

For example, the gas barrier film for use in solar batteries is required to be able to retain a moisture vapor transmission rate of not more than $3\times10^{-3}$ [g/(m$^2$·day)] and the gas barrier properties even in an environment of 85° C. and 85% RH (e.g., even after being allowed to stand for 1000 hours). The gas barrier film for use in various displays such as organic EL displays is required to be able to retain a higher moisture vapor transmission rate of not more than $1\times10^{-5}$ [g/(m$^2$·day)] and the gas barrier properties even in an environment of 60° C. and 90% RH (e.g., even after being allowed to stand for 1000 hours).

The production method of the present invention is capable of consistently producing the gas barrier films satisfying both the requirements. According to the present invention, it is also possible to eliminate the necessity to separately deposit an inorganic film for ensuring the oxidation resistance in order to impart excellent oxidation resistance. In other words, it is also possible to minimize the reduction of the transparency due to deposition of another layer. That is, since the flexible film Z having at least a part of a surface made of an organic material is particularly advantageous, the gas barrier film of the present invention is suitable for use as the gas barrier film for displays and the gas barrier film for solar batteries.

The first predetermined period of time, that is, the time period it takes to stabilize the plasma discharge from the start of the plasma discharge (from the passage of the boundary E through the discharge region or film deposition region) to such an extent that the gas barrier layer having the desired gas barrier properties and oxidation resistance can be produced depends on the type of gas barrier layer to be formed, the type of gases used for the material and the plasma excitation power. Therefore, the time period it takes to stabilize the plasma discharge to such an extent that the desired gas barrier film can be produced may be appropriately set in accordance with these factors.

Alternatively, the time period it takes to stabilize the plasma discharge from the start of the plasma discharge to such an extent that the desired gas barrier layer can be produced may be experimentally determined.

According to the studies made by the inventors of the invention, the discharge may often stabilize after the elapse of at least 3 seconds from the start of the plasma discharge to obtain such a plasma discharge that the gas barrier layer having the desired performance can be produced. The plasma discharge stabilizes particularly after the elapse of at least 10 seconds from the start of the discharge, thus enabling the gas barrier layer having the desired performance to be produced more reliably.

Therefore, in the present invention, the first predetermined period of time is preferably set to at least 3 seconds and more preferably at least 10 seconds. The second predetermined period of time may be appropriately set in accordance with the travel speed of the flexible film and the configuration of the film deposition chamber so that the time period it takes after the passage of the boundary E having reached the film deposition chamber 14 through the film deposition region reliably exceeds 3 seconds (particularly 10 seconds).

The control means 56, the detection means 54 and the marking means 52 as well as the method of producing the gas barrier layer of the invention are described below in further detail by referring to the operations for forming the gas barrier layer in the film deposition chamber 14.

As described above, upon mounting of the substrate roll 20 on the rotary shaft 24, the flexible film Z is let out from the substrate roll 20 and travels along the predetermined travel path along which the flexible film Z in the feed chamber 12 is guided by the guide roller 26 to reach the film deposition chamber 14, where the flexible film Z is guided by the guide roller 40, wrapped over a predetermined region of the peripheral surface of the drum 36 and guided by the guide roller 42 to reach the take-up chamber 16, where the flexible film Z is guided by a guide roller 58 to reach the take-up shaft 30.

The flexible film Z fed from the feed chamber 12 and guided by the guide roller 40 along the predetermined path travels on the predetermined travel path as it is supported/guided by the drum 36. The internal pressure of the film deposition chamber 14 is reduced by the vacuum evacuation means 50 to a predetermined degree of vacuum. The internal pressures of the feed chamber 12 and the take-up chamber 16 are reduced by the vacuum evacuation means 28 and 60 to predetermined degrees of vacuum, respectively.

In addition, the gas supply means 46 supplies to the shower head electrode 38 material gases, more specifically a material gas having Si—H bonds, a material gas having N—H bonds, and at least one of nitrogen gas, hydrogen gas and noble gases. In this way, the material gases are supplied to the space between the shower head electrode 38 and the flexible film Z (drum 36).

Upon stabilization of the amount of supplied material gases and the degree of vacuum in the film deposition chamber 14, the RF power source 48 supplies the plasma excitation power to the shower head electrode 38 to start the plasma discharge. In cases where the flexible film Z having no guide base portion Zg is used, as described above, the marking means 52 marks the flexible film after the elapse of the first predetermined period of time from the start of the discharge.

In the illustrated production device 10, the drum 36 serves as a counter electrode and forms with the shower head electrode 38 an electrode pair in CCP-CVD, as described above.

The plasma excitation power is supplied to the shower head electrode 38 to cause plasma excitation in the space between the shower head electrode 38 and the drum 36 to generate radicals from the material gases, whereby the gas barrier layer is formed on the surface of the flexible film Z which is traveling as it is supported by the drum 36.

Upon start of traveling of the flexible film Z, the detection means 54 starts detection of the boundary E in the flexible film Z and informs the control means 56 of the detection of the boundary E (sends the detection signal) when the boundary E was detected.

Upon receipt of the detection signal, the control means 56 starts time measurement and determines from the distance between the detection means 54 and the film deposition chamber 14 and the travel speed, the timing at which the boundary E reaches the film deposition chamber 14, and issues a command to the marking means 52 so that marking may be made at the point in time when the second predetermined period of time has elapsed from the entry of the boundary E into the film deposition chamber 14.

In response to the command, the marking means 52 marks the surface of the flexible film Z by, for example, laser marking with laser beams.

The flexible film Z on the advancing end side from the marking position (gas barrier film) may be an improper region where the gas barrier layer is formed in an unstable plasma discharge state and hence must be removed.

Therefore, such a marking operation enables an improper region to be easily detected after the gas barrier layer has been formed.

In the meantime, the flexible film used in the production method of the present invention may be one having a lot of layers formed on a base material B as shown in FIG. 2. In order to minimize the reduction of the gas barrier properties due to pin holes, the gas barrier layer may often have a plurality of layers with different layers interposed therebetween.

For example, the embodiment shown in FIG. 2 may be such that layers b, d and f are the gas barrier layers and layers a, c and e are layers having other functions.

The travel speed of the flexible film Z is of course well known. Therefore, it is possible to detect under time control the region where the gas barrier layer was formed before the elapse of the first predetermined period of time from the start of the discharge (or before the elapse of the second predetermined period of time from the entry of the boundary E into the film deposition chamber 14) (this region is hereinafter referred to as "improper region" for descriptive purposes), and to make the flexible film Z travel so that the improper regions are in agreement with each other in all of the gas barrier layers b, d and f, or to control the start of the plasma discharge. However, in cases where the multi-layered gas barrier is formed as described above, mounting of the substrate roll 20 on the rotary shaft 24 and traveling of the flexible film to the take-up shaft 30 may very often cause errors in the positions of the improper regions under time control. In addition, in cases where the proper regions and the improper regions are both transparent, such a method is more likely to cause errors.

Even in cases where such multi-layered gas barrier is formed, the improper regions can be reliably detected by putting marks which are capable of visual detection (detection with visible light) as by marking with laser beams or which are capable of detection with, for example, infrared light.

Therefore, even in cases where such multi-layered gas barrier is formed, such marking ensures that the improper region in each layer of the multi-layered gas barrier is detected to prevent improper products from being provided.

The flexible film Z having the gas barrier layer formed thereon (i.e., gas barrier film) travels from the drum 36 to the guide roller 42 and is guided by the guide roller 42 to pass through a slit 57a formed in a partition wall 57 separating the film deposition chamber 14 from the take-up chamber 16, thus reaching the take-up chamber 16.

In the illustrated embodiment, the take-up chamber 16 includes the guide roller 58, the take-up shaft 30 and the vacuum evacuation means 60.

The flexible film Z (gas barrier film) having reached the take-up chamber 16 travels to the take-up shaft 30 as it is guided by the guide roller 58 and is wound on the take-up shaft 30 to form a roll, which is then supplied to the subsequent step as a roll of gas barrier film.

The take-up chamber 16 is also provided with the vacuum evacuation means 60 as in the feed chamber 12 and during film deposition, its pressure is reduced to a degree of vacuum suitable for the film deposition pressure in the film deposition chamber 14.

In the gas barrier film produced by the production method of the present invention, the region on the upstream side from the marking position is not used as a product but is excluded. In other words, plasma before the elapse of the first predetermined period of time from the start of the discharge for forming the gas barrier layer is not used for the production.

The above-described embodiment refers to the case where the method of producing the gas barrier layer in the present invention is used to produce gas barrier films by a roll-to-roll system. However, this is not the sole case of the present invention and as described above, the gas barrier layer may be formed on substrate sheets, optical devices such as lenses and displays and solar batteries. In other words, the present invention may be used to produce the gas barrier layer in a so-called batch type plasma CVD device.

In producing the gas barrier layer by a batch process, the gas barrier layer may be produced by a means of moving the flexible film to the plasma discharge region (film deposition region) after the elapse of the first predetermined period of time from the start of the plasma discharge for forming the gas barrier layer, i.e., without using the plasma before the elapse of the first predetermined period of time. However, a shutter is preferably provided to separate the flexible film from the gas material introducing position and the electrode so that radicals making up the gas barrier layer may not reach the flexible film.

In cases where the shutter is used, the shutter is opened after the elapse of the first predetermined time of period from the start of the plasma discharge to produce the gas barrier layer without using the plasma before the elapse of the first predetermined period of time. That is, the point in time when the shutter is opened is regarded as the point in time when the plasma discharge for forming the gas barrier layer is started. In this way, the gas barrier layer can be produced in the same manner without using the plasma before the elapse of the first predetermined period of time.

The mechanism using the shutter can also be used for the production of gas barrier films by the roll-to-roll system as shown in FIG. 1. More specifically, the shutter is opened after the elapse of the first predetermined period of time from the start of the plasma discharge or after the elapse of the second predetermined period of time from the entry of the boundary E into the film deposition chamber 14.

In the case of using the shutter, adverse effects of the shutter on the plasma state should be minimized.

In view of this, it is optimal to use the same material as the flexible film (in particular its surface) to form the shutter. In cases where it is difficult to use the same material as the flexible film, the shutter is preferably made of a dielectric material. The whole of the shutter may be made of a material satisfying the above conditions, but part of the shutter such as the surface facing the flexible film or the surface facing the electrode may be made of the material satisfying the above conditions.

For the same reason, the shutter is preferably of a size (volume) having a small volume change (e.g., a volume change of not more than 3%) in the discharge space between the closed state and the open state and is preferably provided at the closest possible position from the flexible film.

While the gas barrier layer production method as well as the gas barrier film for solar batteries and the gas barrier film for displays according to the present invention have been described above in detail, the present invention is by no means limited to the foregoing embodiments and it should be understood that various improvements and modifications may of course be made without departing from the scope and spirit of the invention.

EXAMPLES

The production device 10 shown in FIG. 1 was used to form a gas barrier layer made of silicon nitride on the flexible film Z by CCP-CVD.

The flexible film Z used was a PET film (Lumirror T60 available from Toray Industries, Inc.) with a width of 300 mm and a thickness of 100 μm. The flexible film Z used had no guide base portion Zg but the whole part was composed of the film base portion Zf.

The substrate roll 20 was set on the rotary shaft 24. The flexible film Z was let out from the rotary shaft 24 and was made to travel through the predetermined path which includes the guide rolls 26 and 40, the drum 36 equipped with a temperature adjusting means, and the guide rolls 42 and 58 and is terminated by the take-up shaft 30. The flexible film Z was then wound on the take-up shaft 30.

Then, all the doors of the production device 10 were closed and the vacuum evacuation means 28, 50 and 60 were driven to start vacuum evacuation. Traveling of the flexible film Z was also started in parallel. The travel speed of the flexible film Z was set to 3.3 m/min.

At the point in time when the pressure had reached 0.01 Pa in all the chambers, the gas material including silane gas ($SiH_4$), ammonia gas ($NH_3$), nitrogen gas ($N_2$) and hydrogen gas ($H_2$) was supplied from the gas supply means 46 to the shower head electrode 38 and each vacuum evacuation means was adjusted for the amount of evacuation so that the pressure was increased to 80 Pa in all the chambers.

The gas material was adjusted so as to use silane gas and ammonia gas at flow rates of 100 sccm, nitrogen gas at a flow rate of 850 sccm, and hydrogen gas at a flow rate of 350 sccm, respectively.

Upon stabilization of the pressure in the film deposition chamber 14, 1600 W of plasma excitation power at a frequency of 13.56 MHz was supplied from the RF power source 48 to the shower head electrode 38 and the plasma discharge was started to form the gas barrier layer made of silicon nitride on a surface of the flexible film Z, thus preparing the gas barrier film using the PET film for the flexible film. Under these conditions, the gas barrier layer was deposited at a static film deposition rate of 310 nm/min to a thickness of 30 nm. The gas barrier layer thickness was controlled based on previously conducted experiments.

During film deposition, the temperature adjusting means built into the drum 36 was used to adjust the temperature of the flexible film to 80° C. or less.

The region where the gas barrier film was formed within a time period of 0 to less than 3 seconds from the start of the plasma discharge, the region where the gas barrier layer was formed within a time period of 3 to less than 6 seconds from the start of the plasma discharge, the region where the gas barrier layer was formed within a time period of 6 to less than 9 seconds from the start of the plasma discharge, and the region where the gas barrier film was formed within a time period of 9 to 12 seconds from the start of the plasma discharge were sampled from the gas barrier film prepared. The respective regions were found based on the travel speed of the flexible film Z, the timing at which the plasma discharge was started, and the timing at which traveling of the flexible film Z was stopped.

The respective samples were evaluated for the moisture vapor transmission rates just after film deposition, after having been stored in an environment of 60° C. and 90% RH for 1000 hours and after having been stored in an environment of 85° C. and 85% RH for 1000 hours. The samples after having been stored for 1000 hours were also evaluated for the oxidation resistance.

[Moisture Vapor Transmission Rate]

The moisture vapor transmission rate [$g/(m^2 \cdot day)$] was measured by the MOCON method. Those samples which exceeded the limit for measurement of the moisture vapor transmission rate by the MOCON method were measured for the moisture vapor transmission rate by the calcium corrosion method (see JP 2005-283561 A).

[Oxidation Resistance]

The composition of the film after the storage was determined by X-ray photoelectron spectroscopy (abbreviated as XPS; Quantera SXM available from Ulvac-Phi, Incorporated) to evaluate the oxidation resistance of the film. The surface and interface portions that were already oxidized before the storage were removed from the whole film and the remaining region (the region with a film thickness of 5 to 45 nm) was rated for the ratio of oxygen to nitrogen (O/N value) based on the following criteria:

Excellent: The difference between before and after storage is within ±3% (substantially no change);

Good: The ratio increase from before to after storage is from 3% to less than 10%;

Fair: The ratio increase from before to after storage is from 10% to less than 50%;

Poor: The ratio increase from before to after storage is 50% or more.

The results are shown in Table 1.

TABLE 1

| | | 0 to less than 3 sec | 3 to less than 6 sec | 6 to less than 9 sec | 9 to 12 sec |
|---|---|---|---|---|---|
| Just after preparation | Barrier properties [g/(m² · day)] | 0.0051 | 0.0023 | 0.0027 | 0.0022 |
| After allowing to stand at 60° C. and 90% RH for 1000 hr | Barrier properties [g/(m² · day)] | 0.077 | 0.0026 | 0.0021 | 0.0019 |
| | Oxidation resistance | Fair | Good | Excellent | Excellent |
| After allowing to stand at 85° C. and 85% RH for 1000 hr | Barrier properties [g/(m² · day)] | 0.29 | 0.039 | 0.0027 | 0.002 |
| | Oxidation resistance | Poor | Fair | Good | Excellent |

As shown in Table 1, in the region where the gas barrier layer was formed within 3 seconds from the start of the plasma discharge, the plasma discharge is deemed to be unstable and, compared to the other regions, this region has insufficient gas barrier properties even just after preparation and has low oxidation resistance in a high temperature and high humidity environment, and the gas barrier properties also deteriorate considerably with time.

In contrast, the region where the gas barrier layer was formed after the elapse of at least 3 seconds from the start of the plasma discharge has excellent gas barrier properties just after preparation, and exhibits improved oxidation resistance in a high temperature and high humidity environment. Deterioration of the gas barrier properties is also minimized. In addition, the region where the gas barrier layer was formed after the elapse of at least 6 seconds and in particular the region where the gas barrier layer was formed after the elapse of at least 9 seconds exhibit excellent gas barrier properties not only just after preparation but also after having been allowed to stand in a high temperature and high humidity environment, and also exhibit sufficient oxidation resistance in a high temperature and high humidity environment.

The region where the gas barrier layer was formed after the elapse of more than 12 seconds was randomly sampled and subjected to the same tests. The results obtained were equal to or better than those obtained in the region where the gas barrier layer was formed within the time period of 9 to 12 seconds.

The above results clearly show the beneficial effects of the present invention.

INDUSTRIAL APPLICABILITY

The present invention can be advantageously used in producing various products which are required to include a gas barrier layer having not only high gas barrier properties but also excellent transparency and oxidation resistance, as exemplified by various displays such as liquid crystal displays and solar batteries.

What is claimed is:

1. A method of producing a gas barrier layer made of silicon nitride, silicon carbide or silicon carbonitride by plasma-enhanced CVD, comprising:

supplying a material of the gas barrier layer to a film deposition chamber;

adjusting the film deposition chamber to a predetermined pressure and traveling an elongated flexible film along a predetermined travel path through the film deposition chamber;

starting plasma discharge for forming the gas barrier layer in the film deposition chamber; and producing the gas barrier layer by using a plasma after a first predetermined period of time has elapsed from a start of the plasma discharge on a surface of the elongated flexible film traveling along the predetermined travel path, wherein the elongated flexible film has a film base portion to serve as a product and a guide base portion connected to an advancing end side of the film base portion, the guide base portion not serving as a product, wherein the plasma discharge for forming the gas barrier layer is started before a boundary between the film base portion and the guide base portion reaches the film deposition chamber, and wherein a point in time when a second predetermined period of time elapsed from entry of the boundary between the film base portion and the guide base portion into the film deposition chamber is regarded as a point in time when the first predetermined period of time has elapsed from the start of the plasma discharge for forming the gas barrier layer.

2. The method according to claim 1, wherein a marking is made at a specified portion of at least one of the flexible film and the formed gas barrier layer after the first predetermined period of time has elapsed from the start of the plasma discharge.

3. The method according to claim 1, wherein a marking is made by putting a mark which can be visually confirmed.

4. The method according to claim 1, wherein the guide base portion is made of a material which is identical to that of the film base portion.

5. The method according to claim 1, wherein the flexible film comprises a base body and a layer structure formed on the base body including at least one layer, the gas barrier layer being formed on the surface of the layer structure.

6. The method according to claim 1, wherein the flexible film comprises a base body and a layer structure formed on the base body, a first said gas barrier layer being formed on the surface of the layer structure, the layer structure comprising a second gas barrier layer.

7. The method according to claim 1, wherein at least a part of the surface of the flexible film is formed with an organic material.

8. The method according to claim 1, wherein the gas barrier layer is formed with a temperature of the flexible film kept at 120° C. or less.

9. The method according to claim 1, wherein the gas barrier layer is formed at a static film deposition rate of at least 300 nm/min.

10. The method according to claim 1, wherein the first predetermined period of time is 3 seconds or more.

11. The method according to claim 1, comprising:
   starting the plasma discharge with a shutter for preventing formation of the gas barrier layer on the flexible film closed; and
   opening the shutter after the first predetermined period of time has elapsed from the start of the plasma discharge to form the gas barrier layer.

12. The method according to claim 11, wherein the shutter is made of a material which is identical to that of the flexible film.

13. The method according to claim 11, wherein the shutter is made of a dielectric material.

14. The method according to claim 1, wherein gas materials including at least one of silane gas and disilane and at least one gas selected from the group consisting of ammonia gas, hydrazine and nitrogen gas are used for the material of the gas barrier layer.

15. The method according to claim 14, wherein at least one gas selected from the group consisting of nitrogen gas, hydrogen gas, helium, neon, argon, krypton, xenon and radon is used for the material of the gas barrier layer in combination with the gas materials.

16. The method according to claim 1, wherein liquid materials including at least one of hexamethyldisilazane (HMDSN) and tetramethylsilane (TMS) are used for the material of the gas barrier layer.

* * * * *